US012761277B2

(12) United States Patent
Yun et al.

(10) Patent No.: US 12,761,277 B2
(45) Date of Patent: Oct. 13, 2026

(54) ELECTRONIC DEVICE AND OPERATION METHOD THEREFOR

(71) Applicant: LG ELECTRONICS INC., Seoul (KR)

(72) Inventors: Sunglyeal Yun, Seoul (KR); Jinseok Im, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 19/145,729

(22) PCT Filed: Jan. 5, 2023

(86) PCT No.: PCT/KR2023/000189

§ 371 (c)(1),
(2) Date: Jul. 3, 2025

(87) PCT Pub. No.: WO2024/147381

PCT Pub. Date: Jul. 11, 2024

(65) Prior Publication Data

US 2026/0110734 A1 Apr. 23, 2026

(51) Int. Cl.
*G01R 31/3185* (2006.01)
*G01R 31/317* (2006.01)
(Continued)

(52) U.S. Cl.
CPC ................ *G01R 31/318525* (2013.01); *G01R 31/31703* (2013.01); *G01R 31/318502* (2013.01);
(Continued)

(58) Field of Classification Search
CPC .... G01R 31/318525; G01R 31/318502; G01R 31/318513; G01R 31/318533;
(Continued)

(56) References Cited

U.S. PATENT DOCUMENTS 7,975,195 B1 * 7/2011 Joshi ............. G01R 31/318541 714/731
11,929,746 B2 * 3/2024 Gupta .................. H03K 3/0372
(Continued)

FOREIGN PATENT DOCUMENTS

JP 2016-176843 10/2016
KR 10-1482940 1/2015
(Continued)

OTHER PUBLICATIONS

Austin et al., Making Typical Silicon Matter with Razor, Mar. 2004, IEEE, pp. 57-65. (Year: 2004).*
(Continued)

*Primary Examiner* — John J Tabone, Jr.

(74) *Attorney, Agent, or Firm* — LEE, HONG, DEGERMAN, KANG & WAIMEY

(57) ABSTRACT

An electronic device and an operating method therefor are disclosed. The electronic device according to at least one of various embodiments of the present disclosure comprises: a memory; a semiconductor device including a functional block, which outputs a result of a specific function performed on an input signal, and a functional safety block, which is for a safety mechanism determining whether the functional block is faulty; and a processor for determining whether the semiconductor device is faulty, wherein the functional safety block can include constituent elements that are the same as pre-configured constituent elements from among constituent elements of the functional block.

13 Claims, 5 Drawing Sheets

(51) Int. Cl.
*G01R 31/3187* (2006.01)
*G01R 31/3193* (2006.01)

(52) U.S. Cl.
CPC ................ *G01R 31/318513* (2013.01); *G01R 31/318533* (2013.01); *G01R 31/318566* (2013.01); *G01R 31/318569* (2013.01); *G01R 31/3187* (2013.01); *G01R 31/3193* (2013.01); *G01R 31/31932* (2013.01)

(58) Field of Classification Search
CPC .... G01R 31/318566; G01R 31/318569; G01R 31/3187; G01R 31/31703; G01R 31/3193; G01R 31/31932
USPC ................ 714/726, 729, 732, 733, 735, 742
See application file for complete search history.

(56) References Cited

U.S. PATENT DOCUMENTS

| | | | | |
|---|---|---|---|---|
| 2006/0005091 | A1* | 1/2006 | Mitra | G01R 31/318566 714/726 |
| 2016/0180912 | A1 | 6/2016 | Song | |
| 2016/0188772 | A1 | 6/2016 | Seo et al. | |
| 2016/0274185 | A1 | 9/2016 | Nishikawa | |
| 2017/0184664 | A1* | 6/2017 | Nicolaidis | G01R 31/31727 |
| 2017/0269156 | A1 | 9/2017 | Fel | |
| 2017/0285106 | A1* | 10/2017 | Maeda | G01R 31/318335 |
| 2019/0011500 | A1* | 1/2019 | Shah | G01R 31/3177 |
| 2019/0303260 | A1 | 10/2019 | Ozer et al. | |
| 2020/0065456 | A1* | 2/2020 | Tehranipoor | G06F 21/14 |
| 2020/0389156 | A1* | 12/2020 | Gupta | H03K 19/007 |
| 2022/0187370 | A1* | 6/2022 | Ng | G01R 31/318536 |

FOREIGN PATENT DOCUMENTS

| | | |
|---|---|---|
| KR | 10-2016-0080586 | 7/2016 |
| KR | 10-1746716 | 6/2017 |

OTHER PUBLICATIONS

Lin et al., Rad-Hard Designs by Automated Latching-Delay Assignment and Time-Borrowable D-Flip-Flop, May 2022, IEEE, vol. 71, No. 5, pp. 1008-1020. (Year: 2022).*
Ernst et al., Razor: A Low-Power Pipeline Based on Circuit-Level Timing Speculation, 2003, IEEE, pp. 1-12. (Year: 2003).*
Ko et al, Combining Scan and Trace Buffers for Enhancing Real-time Observability in Post-Silicon Debugging, 2010 IEEE, pp. 62-67. (Year: 2010).*
Sarrazin et al., Scan design with shadow flip-flops for low performance overhead and concurrent delay fault detection, 2013, EDAA, pp. 1-6. (Year: 2013).*
Sinanoglu, Eliminating Performance Penalty of Scan, 2012, IEEE, pp. 346-351. (Year: 2012).*
PCT International Application No. PCT/KR2023/000189, International Search Report dated Oct. 4, 2023, 4 pages.

* cited by examiner

ELECTRONIC DEVICE AND OPERATION METHOD THEREFOR

CROSS-REFERENCE TO RELATED APPLICATION(S)

This application is the National Stage filing under 35 U.S.C. 371 of International Application No. PCT/KR2023/000189, filed on Jan. 5, 2023, the contents of which is hereby incorporated by reference herein in its entirety.

TECHNICAL FIELD

The present disclosure relates to an electronic device and its operating method, and more specifically, to a method and device for detecting a defect in a semiconductor included in an electronic device.

BACKGROUND ART

Recently, the use of semiconductors in automobile systems has increased significantly, and safety requirements due to complex functions are also increasing.

In particular, the safety level is determined by the Automotive Safety Integrity Level (ASIL) standard according to the ISO 26262 standard, and the level of safety requirements for risk increases from ASIL A to ASIL D, which is evaluated by the occurrence of failures (FIT) per unit time.

In particular, the requirements for functional safety also require a high level of safety from ASIL B to ASIL D, so the configuration of semiconductors must also apply various mechanisms for functional safety.

However, due to the high specifications, high reliability, and high safety requirements of automotive semiconductors, a safety mechanism must be applied, but this increases the chip size and makes it difficult to develop and operate the safety mechanism.

For example, in order to satisfy the ASIL D level, a redundant structure is often applied to automotive semiconductors. However, this redundant structure is problematic because the chip size increases by more than two times as the functional blocks are redundant.

DETAILED DESCRIPTION OF THE INVENTION

Technical Problem

One problem of the present disclosure is to design and apply a safety mechanism to a semiconductor regardless of its function.

Another problem of the present disclosure is to effectively reduce the failure rate of the semiconductor.

Another problem of the present disclosure is to enable real-time verification of the semiconductor.

Another problem of the present disclosure is to reduce the verification time for the semiconductor.

Technical Solution

An electronic device according to at least one embodiment of the present disclosure may comprise: a memory; and a semiconductor device including a functional block configured to output a result obtained by performing a predetermined function on an input signal, and a functional safety block for a safety mechanism configured to determine whether there is a fault in the functional block; and a processor configured to determine whether the semiconductor device has a fault, wherein the functional safety block includes components that are identical to preset components among components of the functional block.

In addition, the components of the functional block may include at least one combinational logic and at least one flip-flop.

In addition, the preset components may include a flip-flop.

In addition, the functional safety block further may include a comparator configured to compare an output value of the flip-flop in the functional block with an output value of a flip-flop operating on the same input value.

In addition, when a plurality of flip-flops are present in the functional safety block, the comparator may be generated only for some of the flip-flops.

In addition, the comparator may be generated for each flip-flop unit in the functional safety block.

In addition, the comparator may be configured to determine a comparison result based on an Exclusive-OR logic.

In addition, when a plurality of flip-flops in the functional block are connected in series, the functional safety block may include only a flip-flop identical to a last flip-flop among the plurality of flip-flops in the functional block, and a comparator.

In addition, when the functional safety block includes at least two comparators, the functional safety block may include at least one AND or OR logic configured to compare the result values of each comparator to determine whether there is a fault in the corresponding functional block.

In addition, the functional safety block may be applied to an instantaneous fault.

In addition, the functional safety block may be provided only for a last functional block among at least two serially connected or mutually related functional blocks.

In addition, the functional safety block may be configured to operate only for some of the functional blocks among at least two serially connected or mutually related functional blocks.

In addition, the functional safety block may be configured to operate only for a functional block that is set to have a priority equal to or higher than a preset priority or a high level of importance based on the priority or importance of the functional block.

In addition, the comparator may be configured to generate an identification signal on whether there is a fault based on a result of comparison of an identifier of the comparator and the target flip-flop.

In addition, the semiconductor device may be applied to an automobile system.

Effects of the Invention

According to at least one of the various embodiments of the present disclosure, the following effects are provided.

First, a safety mechanism can be designed and applied to a semiconductor regardless of its function.

Second, it can effectively reduce the failure rate of transient faults, which account for a large portion of the semiconductor failure rate.

Third, real-time verification of semiconductors can be possible.

Fourth, since separate test cases are not required, the verification time for semiconductors can be reduced.

BEST MODE

Figure 1:
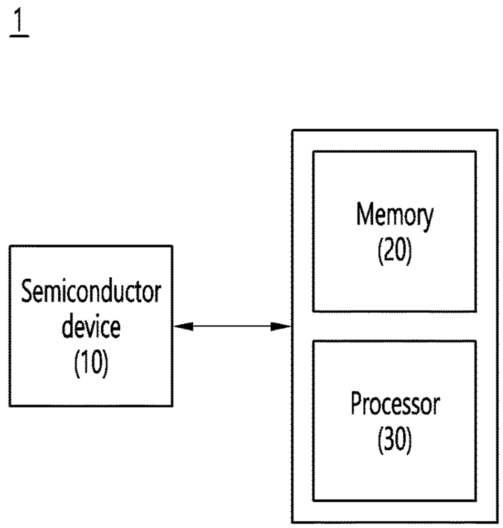
FIG. 1 is a block diagram of an electronic device according to an embodiment of the present disclosure.

Hereinafter, embodiments related to the present disclosure will be described in more detail with reference to the drawings. The suffixes "module" and "part" used for components in the following description are given or used interchangeably only for the convenience of writing the specification, and do not have distinct meanings or roles in themselves.

The following description discloses a fault detection device for a semiconductor and its operation method.

The semiconductor is described using an automotive system, for example, a vehicle semiconductor, as an example, but is not limited thereto.

Various terms described in this description may be interpreted as terms defined in the ISO 26262 standard or referred to.

For example, the "Automotive Safety Integrity Level (ASIL)" described in this description is one of four levels that specify requirements required for items or elements of functional safety, and may indicate safety measures applied to prevent unreasonable residual risks. According to the aforementioned standard, the Automotive Safety Integrity Level (ASIL) is defined as four levels (ASIL A to ASIL D) according to the degree of stringency for functional safety, and the ASIL D level is defined as the highest level of stringency for functional safety, and the ASIL A level is defined as the lowest level.

The term "fault" described in this specification can be defined as an abnormal state that can cause a failure in the aforementioned item or element. On the other hand, a failure can be defined as a state in which the ability to perform a required function is terminated due to a fault. In other words, a fault can be expressed as a cause that causes a failure. From the perspective of functional safety, the terms fault and failure can be used separately, and one of the main goals of functional safety is to discover a fault during operation and take action before a failure occurs and causes a system failure or problem.

The "failure rate" described in this specification may represent the probability density of a failure of a hardware element divided by the probability of survival.

The "permanent fault" described in this specification may represent a fault that occurs and exists until it is removed or repaired, and the "transient fault" may represent a fault that disappears after it is generated.

The "safety mechanism" described in this specification may represent a technical solution implemented as an electrical/electronic device function or element or other technology to detect a fault or control a fault, thereby reaching or maintaining a safe state. This safety mechanism may be related to an operation that transitions or maintains a fault to a safe state within a specified time, or provides an alert to the driver so that the driver can control the effects of the fault.

In addition, terms or parts of terms described in this specification but not defined separately may be understood by referring to terms defined in the aforementioned ISO 26262 standard.

In automotive semiconductor design, various safety mechanisms are applied to prevent or detect random defects in each element function in order to achieve the functional safety goals required by the system. Meanwhile, technological developments are focused on autonomous driving or driver convenience and safety, and the level of demand for functional safety is gradually increasing. Accordingly, in the automotive semiconductor design process, for example, two identical functional blocks were used regardless of function, and the output values of the two identical functional blocks were simply compared to determine whether a defect occurred based on whether they matched. However, as described above, this caused the chip size to increase by more than twice because the entire functional block for one function was configured identically, i.e., duplicated.

This disclosure discloses how to minimize the increase in chip size while properly applying safety mechanisms to achieve high-risk functional safety goals required by standards, etc. in the automotive semiconductor design process.

In relation to safety mechanisms, it is necessary to understand various complex functions applied to automobiles and analyze fault models that may occur in internal functional blocks so that appropriate safety mechanisms can be provided.

Depending on the complexity of automotive semiconductor chip design, functional safety analysis may become difficult as safety mechanisms are applied, and thus new faults may be introduced during fault analysis.

Meanwhile, in automotive semiconductor chip design, most faults are instantaneous faults caused by temporary changes in stored values rather than permanent faults. Such instantaneous faults are becoming more dominant, especially as semiconductor manufacturing processes become increasingly finer, and therefore, a safety mechanism capable of determining whether a fault has occurred in real time is required to detect them.

Considering the above, in one embodiment of the present disclosure, a safety mechanism is designed and applied regardless of function in the semiconductor chip design. To this end, the present disclosure designs a safety mechanism using a storage, for example, a flip-flop, rather than combinational logic. However, the present disclosure is not limited thereto.

Therefore, according to the present disclosure, a lightweight safety mechanism can be designed and applied regardless of function, thereby reducing the size of a semiconductor chip for vehicles, thereby reducing chip power consumption and improving system efficiency.

In addition, through the application of the safety mechanism according to the present disclosure, the failure rate due to momentary defects can be reduced, in particular.

In addition, the safety mechanism according to the present disclosure can be verified in real time, and since a separate test case is unnecessary, the verification time can be reduced.

Hereinafter, with reference to the attached drawings, an embodiment of the present disclosure will be described in detail.

FIG. 1 is a block diagram of an electronic device 1 according to an embodiment of the present disclosure.

Referring to FIG. 1, an electronic device 1 according to an embodiment of the present disclosure may be configured to include a semiconductor device 10 and a defect detection device.

However, the present disclosure is not limited thereto, and at least one or more components not shown in FIG. 1 may be further included to configure the electronic device 1.

The defect detection device may be configured to include a memory 20 and a processor 30.

The memory 20 may store various types of data.

The processor 30 may perform or control various operations such as processing defect detection data in the semiconductor device, generating and outputting an alarm signal such as a warning according to the defect detection data, and controlling other subsequent processing according to the defect detection results.

Although not shown, the processor 30 may be implemented including the configuration necessary to perform the aforementioned operation.

The processor 30 may perform the aforementioned operation or operation control as a unit of at least one of a semiconductor device unit, a functional block unit, a group unit in which a plurality of functional blocks are grouped, and a logic or flip-flop unit within a functional block.

Figure 2:
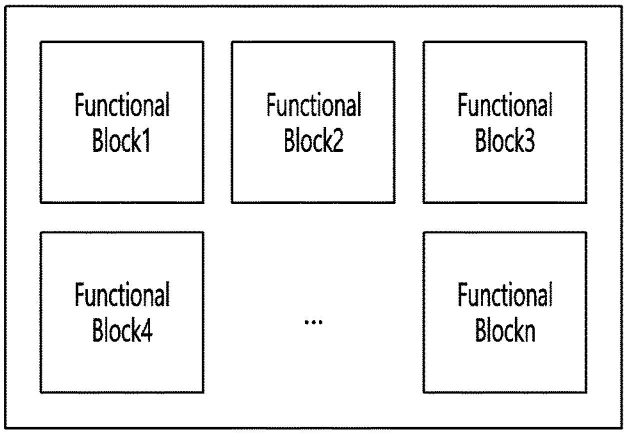
FIG. 2 is a diagram illustrating a semiconductor for a vehicle in relation to the present disclosure.

FIG. 2 is a drawing illustrating a semiconductor device in relation to the present disclosure.

Figure 3:
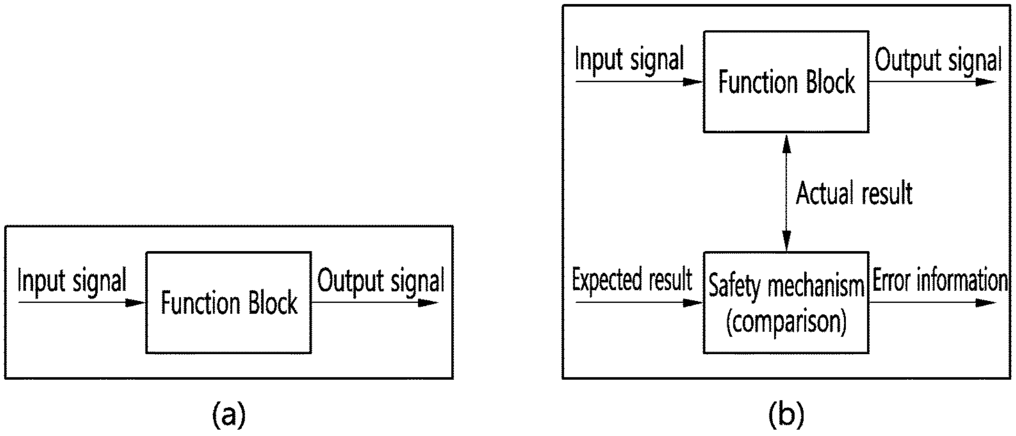
FIG. 3 is a diagram illustrating a functional block in relation to the present disclosure.

FIG. 3 is a drawing illustrated to explain a functional block in relation to the present disclosure.

Figure 4:
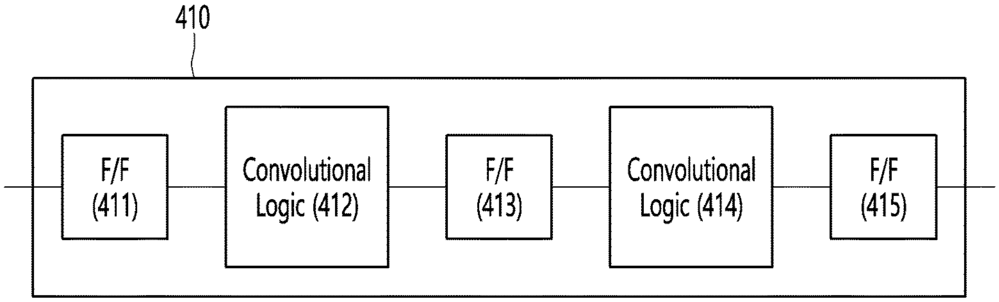
FIG. 4 is a diagram illustrating a configuration of a functional block in relation to the present disclosure.

FIG. 4 is a drawing illustrated to explain the configuration of a functional block in relation to the present disclosure.

Figure 5:
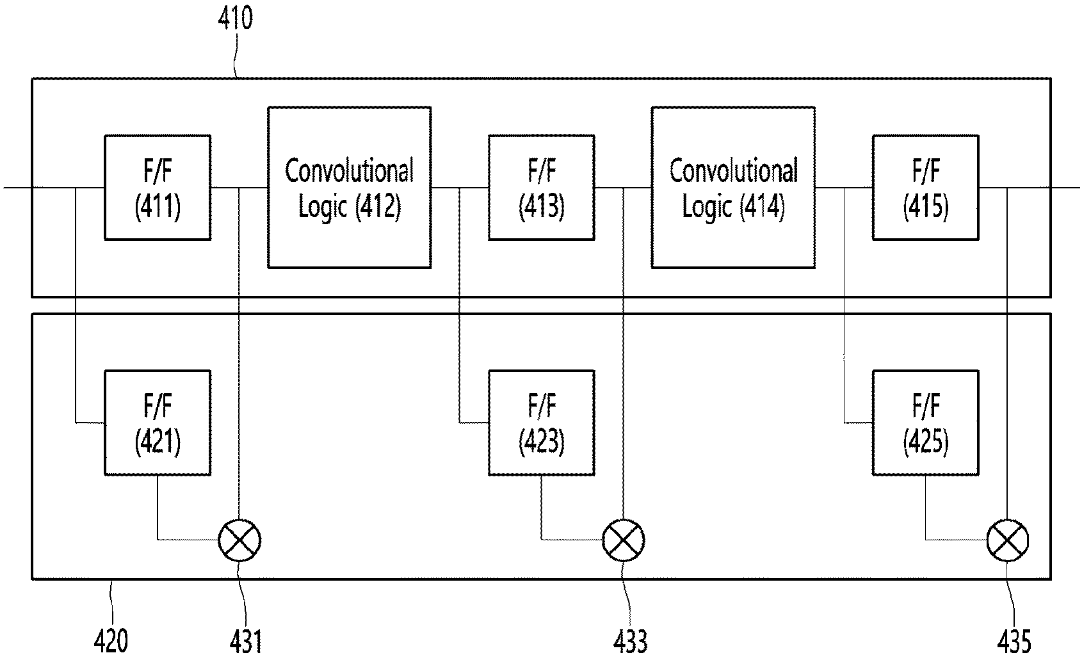
FIGS. 5 and 6 are diagrams illustrating a configuration of a functional block and a functional safety block in relation to an embodiment of the present disclosure.
Figure 6:
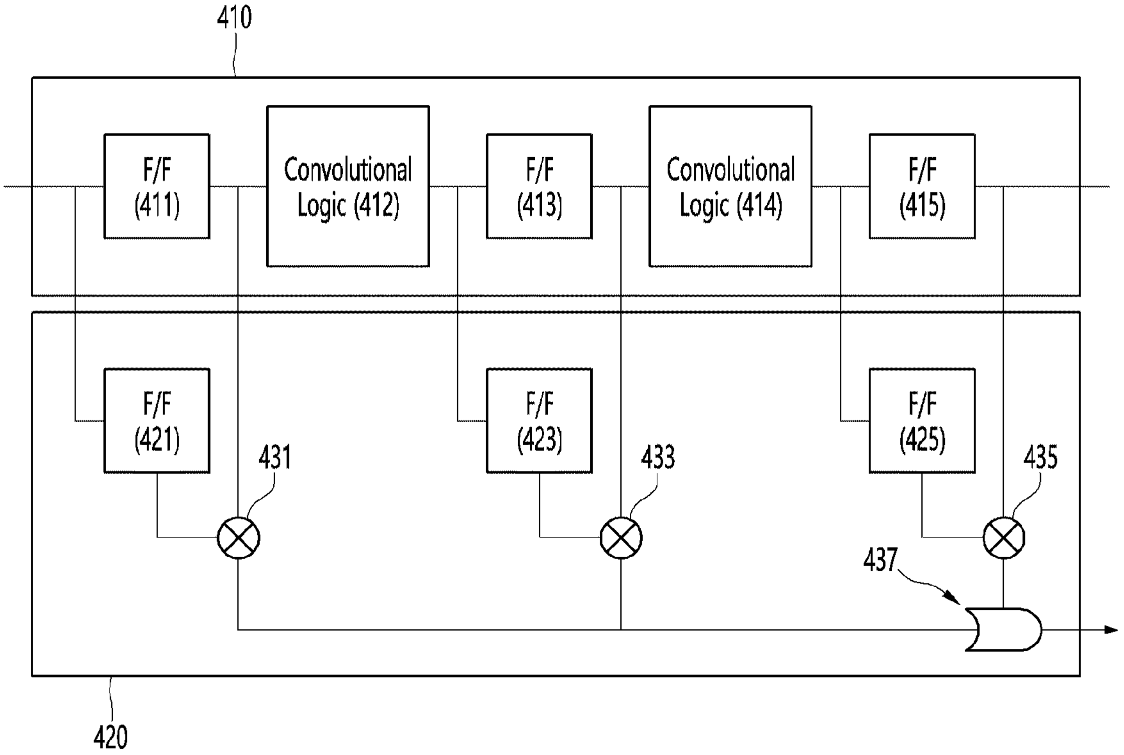

FIGS. 5 and 6 are drawings illustrated to explain the configuration of a functional block and a functional safety block according to one embodiment of the present disclosure.

Figure 7:
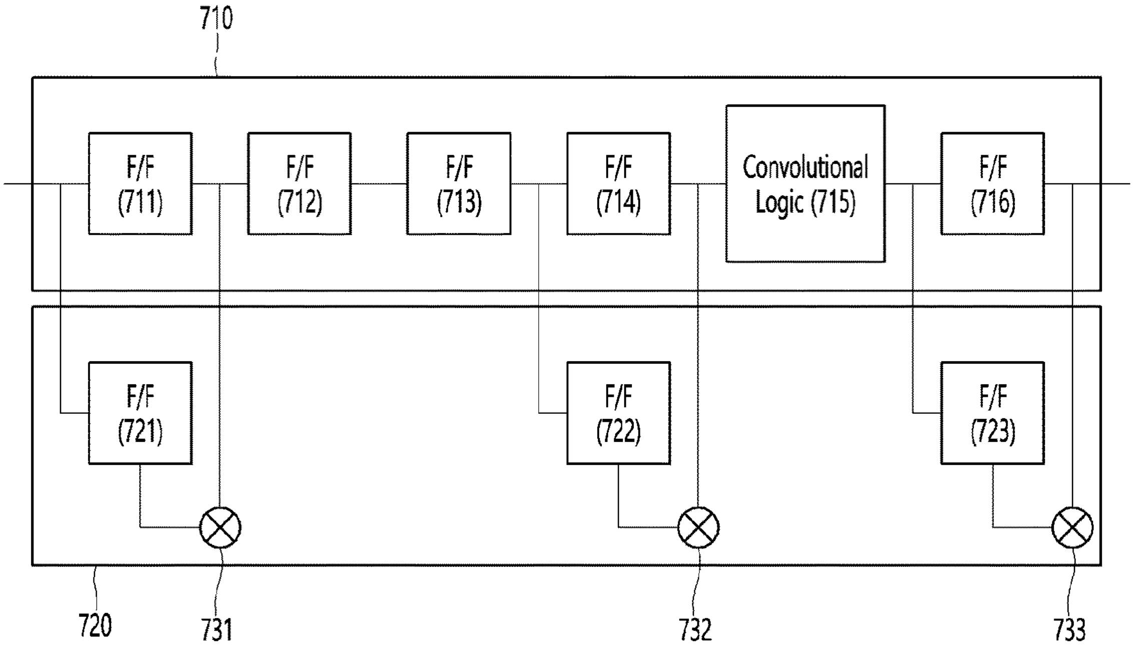
FIG. 7 is a diagram illustrating a configuration of a functional block and a functional safety block in relation to another embodiment of the present disclosure.

FIG. 7 is a drawing illustrated to explain the configuration of a functional block and a functional safety block according to another embodiment of the present disclosure.

Figure 8:
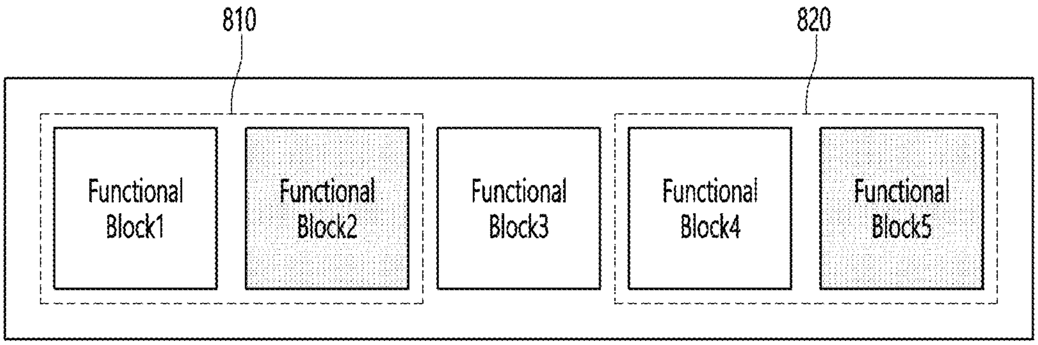
FIG. 8 is a diagram illustrating a method for detecting a defect in a functional block unit in relation to an embodiment of the present disclosure.

FIG. 8 is a diagram illustrating a method for detecting a defect in a functional block unit according to an embodiment of the present disclosure.

Figure 9:
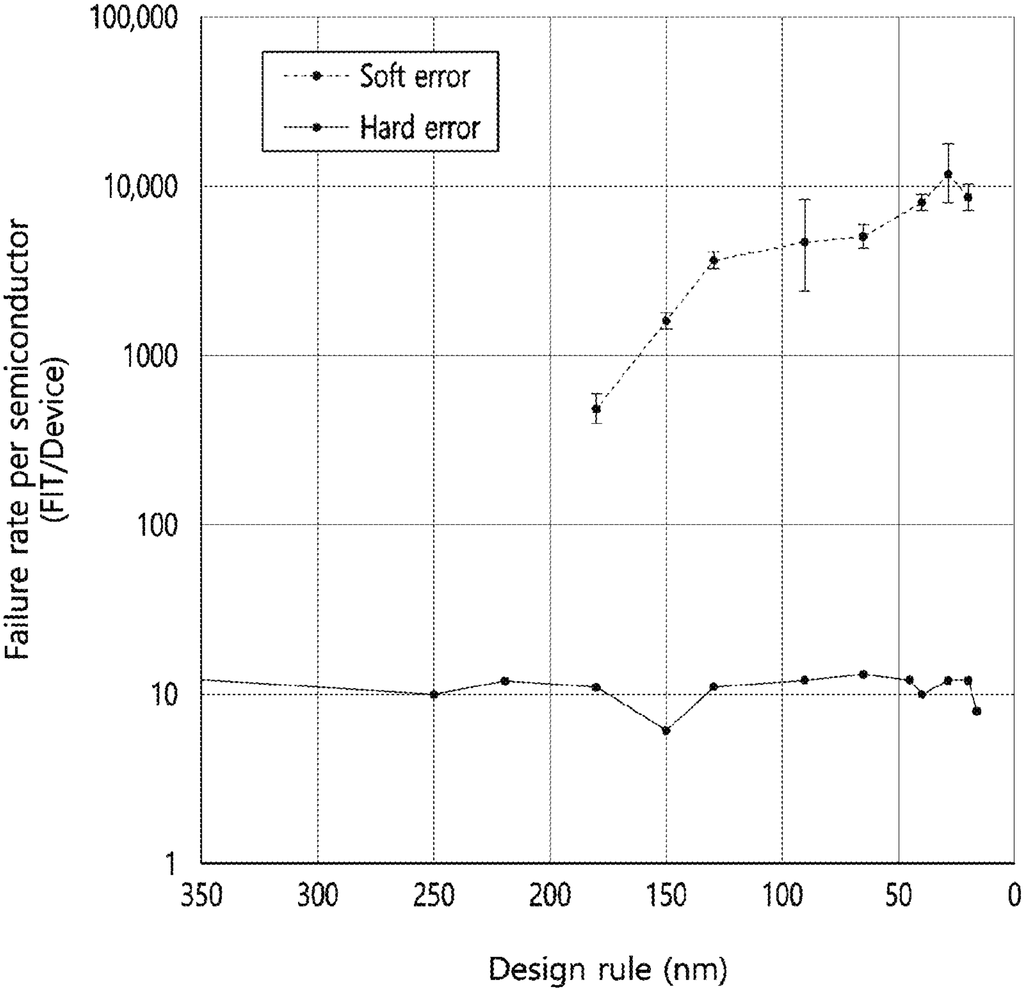
FIG. 9 is a diagram illustrating a relationship between a failure rate and a design rule in relation to the present disclosure.

FIG. 9 is a diagram illustrating a relationship between a failure rate and a design rule in relation to the present disclosure.

Referring to FIG. 2, the configuration of a semiconductor device is described as follows.

One semiconductor device (or chip) may include n (where n is a natural number) functional blocks.

In this case, each functional block may be related to at least one function.

According to an embodiment, some of the n functional blocks included in one semiconductor device (e.g., a plurality of functional blocks) may be grouped into one group 810, 820 as illustrated in FIG. 8 and may be subject to group control.

Referring to FIG. 3, the functional block is described in more detail.

(a) of FIG. 3 illustrates a functional block of a commercial semiconductor device, and (b) of FIG. 3 illustrates a functional block of a vehicle semiconductor device, for example.

In general, a functional block generates and provides an output signal as an operation result according to an input signal.

Unlike the commercial semiconductor device illustrated in (a) of FIG. 3, the vehicle semiconductor device illustrated in (b) of FIG. 3 further includes a block for a safety mechanism for the functional block, i.e., a functional safety block hereinafter.

The functional safety block can generate and provide error information as an output signal based on the expected result and the actual result of the actual function block as input. At this time, the error information may include at least one of information on whether an error occurred, error type information, and information on a functional block in which an error occurred (e.g., an identifier).

Referring to FIG. 4, the configuration of the functional block of the vehicle semiconductor device is illustrated. However, this is only an example, and the present disclosure is not limited thereto.

One function block may be configured to include at least one combinational logic, at least one storage for storing the operation result of the combinational logic, etc.

In the above, the storage is described using a flip-flop as an example, but is not limited thereto.

The function block illustrated in FIG. 4 is exemplified by two combinational logics 412, 414 and three flip-flops 411, 413, 415, for example. As described above, the present disclosure is not limited thereto.

Meanwhile, in FIG. 4, the flip-flops 411, 413, 415 are illustrated as being placed between the combinational logics 412, 414, but the present disclosure is not limited thereto.

In other words, the flip-flop may not necessarily be placed between combinational logics.

In relation to this, a plurality of flip-flops may be placed in series, as illustrated in FIG. 7.

Hereinafter, a functional safety block for a safety mechanism for a single functional block according to the present disclosure is described.

In FIG. 5, a functional block and a functional safety block according to an embodiment of the present disclosure are illustrated.

In the present disclosure, a storage, that is, a flip-flop, is dualized to form a functional safety block as an example.

As described above, random faults in semiconductors can be divided into permanent faults and transient faults (or temporary faults).

However, the number of faults per unit time (FIT) is hundreds of times higher for transient faults, as illustrated in FIG. 9, so a mechanism for detecting transient faults is essential in order to achieve the required safety level (e.g., ASIL D).

In relation to this, the present disclosure does not duplicate the entire function block or the combination logic within the function block, but only duplicates the flip-flop that stores the result of the combination logic, thereby performing a safety mechanism operation appropriate to the function.

According to the present disclosure, since duplication is performed only for at least one flip-flop included in one function block, it can be independent of the function. In other words, since duplication is not performed for the combinational logic included in the function block, the safety mechanism can be operated or the same result can be derived without being dependent on the function.

Referring to FIG. 5, the configuration of the function block 410 and the functional safety block 420 for the safety mechanism is illustrated.

The functional safety block 420 can be equipped with the same flip-flops 421, 423, 425 as the flip-flops 411, 413, 415 within the function block 410.

At this time, each flip-flop 421, 423, 425 in the functional safety block can receive the same input signal as each flip-flop 411, 413, 415 in the corresponding functional block, and can output a result according to the input signal.

In FIG. 5, a comparator 431, 433, 435 connected to each flip-flop 421, 423, 425 of the functional safety block 420 is illustrated.

The comparator 431, 433, 435 of the functional safety block 420 can receive the output of each flip-flop 411, 413, 415 of the functional block and the output of each flip-flop 421, 423, 425 of the corresponding functional safety block, and compare them.

In the present disclosure, the comparators 431, 433, 435 are for performing a safety mechanism operation, and are intended to determine whether the outputs of each flip-flop 411, 413, 415 of the aforementioned functional block and the outputs of each flip-flop 421, 423, 425 of the corresponding functional safety block are identical.

Therefore, the comparators 431, 433, 435 in the present disclosure may be formed based on Exclusive-OR logic. However, the present disclosure is not limited thereto, and various means for comparing at least two values may be referenced or replaced.

Meanwhile, since each comparator 431, 433, 435 in the present disclosure compares the result values of 1 bit, if they are identical values based on Exclusive-OR logic, it may be determined that a defect has occurred.

In FIG. 6, a configuration is illustrated that determines a final fault in a functional block unit or a flip-flop unit based on the output of the comparators 431, 433, 435 in the functional safety block 420 following FIG. 5.

In explaining FIG. 6, the description of the same configuration as FIG. 5 is referred to the above, and the differences are mainly described below.

In FIG. 6, the fault determination configuration determines whether there is a final fault, i.e., whether there is a fault for the functional block 410, based on the output of all comparators 431, 433, 435 in the functional safety block 420, for example, and can be implemented by referring to AND or OR logic.

If the fault determination configuration is implemented based on, for example, the AND or OR logic described above, the fault detection results according to the present disclosure can be processed so that if even one fault occurs based on each comparison result value since there are multiple fault detection results in one function block 410, the final fault detection result can be determined as a fault.

That is, if even one fault occurs in the fault detection determination result for each flip-flop 4111, 413, 415 included in the function block 410, it is desirable to consider the corresponding function block 410 as a fault occurrence, and accordingly, fault removal or fault resolution processing should be performed.

Meanwhile, FIG. 7 illustrates another embodiment of the fault detection method of the present disclosure.

As described above, when configuring the function block 410, it is not necessary for the flip-flops to be arranged between the combinational logics, and as illustrated in FIG. 7, a plurality of flip-flops 711-714 may be arranged in series or consecutively. Of course, in FIG. 7, other flip-flops 714, 716 may be viewed as arranged between the combinational logics 715.

In such a case, the configuration of the functional safety block may be different from the embodiment described above.

Taking FIG. 7 as an example, when four flip-flops 711-714 are connected in series to the function block 710, the functional safety block 720 may be redundant only for some of the four flip-flops 711-714 in the function block 710, unlike the embodiment described above.

Therefore, for example, in FIG. 7, redundancy can be performed in the functional safety block 720 only for the first flip-flop 711 of the serial connection and the last flip-flop 714 of the serial connection.

Therefore, while the functional block 710 in FIG. 7 is equipped with a total of five flip-flops, the functional safety block 720 is equipped with only a total of three flip-flops to perform operations for the safety mechanism.

Meanwhile, in FIG. 7, the comparators 731-733 can be implemented corresponding to each flip-flop 721-723. However, it is not necessarily limited thereto. For example, in FIG. 7, the result data of each flip-flop can be collected in one flip-flop (e.g., 733) and an integrated comparison can be performed.

Since the above-described embodiment detects whether a defect exists through individual comparison, it is possible to estimate which flip-flop or combinational logic has a defect, whereas in the case of integrated comparison through a single comparator, it is possible to detect a defect in a functional block unit, but it may be difficult to determine which flip-flop has a defect. Of course, by assigning an identifier to the result of each flip-flop and distinguishing the data input to the comparator for integrated comparison, it is possible to identify the flip-flop or part where a defect has occurred.

As described above, FIG. 8 illustrates grouping some of the multiple functional blocks included in one semiconductor device.

At this time, the criteria for grouping may be determined based on, for example, the relevance of functions, whether the functional block performs an important function, the operating time of the functional block, etc.

In FIG. 8, for example, function blocks 1 and 2 are defined as one group 810, and function blocks 4 and 5 are defined as another group 820.

According to an embodiment, a candidate or representative function block for defect detection among the groups may be selected, and only the selected function block may be configured with a functional safety block according to FIGS. 5 to 7 to perform defect detection.

According to at least one embodiment of the various embodiments of the present disclosure described above, for example, a semiconductor defect detection device may include a memory, a function block that outputs a result of a specific function being performed on an input signal, a semiconductor device including a functional safety block for a safety mechanism that determines whether the function block is defective, and a processor that determines whether the semiconductor device is defective.

Meanwhile, as described above, the functional safety block may include a preset component among the components of the function block, that is, a flip-flop.

The above functional safety block may further include a comparator that compares the output value of a flip-flop operating on the same input value with the output value of the flip-flop in the functional block.

The above comparator may be generated only for some flip-flops when there are multiple flip-flops in the functional safety block. Alternatively, the comparator may be generated for each flip-flop unit in the functional safety block.

The functional safety block may include at least one AND or OR logic that compares the result values of each comparator when there are at least two or more comparators to determine whether the corresponding functional block is defective.

The safety mechanism in the functional safety block according to the present disclosure may be applied particularly to a momentary fault, but is not necessarily limited thereto.

The functional safety block may be provided only for the last functional block among at least two or more serially connected or mutually related functional blocks.

The functional safety block may be operated only for some of the functional blocks among at least two or more serially connected or mutually related functional blocks.

The functional safety block can operate only for a function block whose priority is higher than or equal to a preset priority or whose priority is set to high, according to the priority or importance of the function block.

The comparator can generate a signal for identifying whether there is a defect based on the comparison result value of its own identifier and the comparison result of the target flip-flop.

Meanwhile, the semiconductor device according to the present disclosure can be applied to an automobile system.

According to at least one of the various embodiments of the present disclosure described above, the failure rate can be effectively reduced for a transient fault that accounts for a large portion of the failure rate, real-time verification is possible, and verification time can be reduced because a separate test case is not required.

The present disclosure can be applied to various electronic devices that include semiconductors in addition to automotive semiconductors.

According to one embodiment of the present invention, the above-described method can be implemented as a code that can be read by a processor on a medium in which a program is recorded. Examples of media that can be read by a processor include ROM, RAM, CD-ROM, magnetic tape, floppy disk, optical data storage device, etc.

The display device described above is not limited to the configuration and method of the embodiments described above, and the embodiments may be configured by selectively combining all or part of each embodiment so that various modifications can be made.

INDUSTRIAL APPLICABILITY

According to the semiconductor defect detection method and device according to the present disclosure, the failure rate of automotive semiconductors can be effectively reduced, real-time verification is possible, and verification time can be reduced, and it can be applied to various electronic devices containing semiconductors, so there is industrial applicability.

What is claimed is:

1. An electronic device comprising:

a memory; and a semiconductor device including a functional block comprising at least one combinational logic and at least one flip-flop, the functional block configured to output a result obtained by performing a function based on the at least one combinational logic on an input signal, and a functional safety block for a safety mechanism configured to detect a fault in the functional block and comprising at least one duplicate flip flop corresponding to the at least one flip flop of the functional block without duplicating the at least one combinational logic; and a processor configured to determine whether the semiconductor device has a fault based on a fault detection result from the functional safety block, wherein the fault detection result is based on a comparison of an output value of the at least one flip flop of the functional block given an input value with an output value of the at least one duplicate flip flop of the functional safety block given the same input value.

2. The electronic device according to claim 1, wherein the functional safety block further includes a comparator configured to perform the comparison.

3. The electronic device according to claim 2, wherein when a plurality of flip-flops are present in the functional safety block, the comparator is generated only for some of the flip-flops.

4. The electronic device according to claim 2, wherein the comparator is generated for each flip-flop unit in the functional safety block.

5. The electronic device according to claim 2, wherein the comparator is configured to determine a comparison result based on an Exclusive-OR logic.

6. The electronic device according to claim 2, wherein when a plurality of flip-flops in the functional block are connected in series, the functional safety block includes only a flip-flop identical to a last flip-flop among the plurality of flip-flops in the functional block, and a comparator.

7. The electronic device according to claim 2, wherein when the functional safety block includes at least two comparators, the functional safety block includes at least one AND or OR logic configured to compare the result values of each comparator to determine whether there is a fault in the corresponding functional block.

8. The electronic device according to claim 1, wherein the functional safety block is applied to an instantaneous fault.

9. The electronic device according to claim 1, wherein the functional safety block is provided only for a last functional block among at least two serially connected or mutually related functional blocks.

10. The electronic device according to claim 1, wherein the functional safety block is configured to operate only for some of the functional blocks among at least two serially connected or mutually related functional blocks.

11. The electronic device according to claim 1, wherein the functional safety block is configured to operate only for a functional block that is set to have a priority equal to or higher than a preset priority or a high level of importance based on the priority or importance of of the functional block.

12. The electronic device according to claim 2, wherein the comparator is configured to generate an identification signal on whether there is a fault based on a result of the comparison.

13. The electronic device according to claim 1, wherein the semiconductor device is applied to an automobile system.

* * * * *